United States Patent
Joo

(10) Patent No.: US 9,159,386 B2
(45) Date of Patent: Oct. 13, 2015

(54) SEMICONDUCTOR DEVICES AND REDUCTION OF OPERATION TIMES

(71) Applicant: SK hynix Inc., Icheon-si Gyeonggi-do (KR)

(72) Inventor: Byoung In Joo, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/306,479

(22) Filed: Jun. 17, 2014

(65) Prior Publication Data

US 2015/0170723 A1    Jun. 18, 2015

(30) Foreign Application Priority Data

Dec. 16, 2013    (KR) .................... 10-2013-0156117

(51) Int. Cl.
| | |
|---|---|
| *G11C 5/14* | (2006.01) |
| *G11C 7/22* | (2006.01) |
| *G11C 7/12* | (2006.01) |
| *G11C 8/10* | (2006.01) |

(52) U.S. Cl.
CPC .. *G11C 7/22* (2013.01); *G11C 7/12* (2013.01); *G11C 8/10* (2013.01)

(58) Field of Classification Search
CPC ........... G11C 5/14; G11C 5/142; G11C 5/148
USPC ................. 365/226, 230.03, 189.14
See application file for complete search history.

(56) References Cited

U.S. PATENT DOCUMENTS

| | | | |
|---|---|---|---|
| 2006/0203550 A1* | 9/2006 | Lee .......................... | 365/185.13 |
| 2014/0104947 A1* | 4/2014 | Yamauchi et al. ....... | 365/185.09 |

FOREIGN PATENT DOCUMENTS

| | | |
|---|---|---|
| KR | 1020020012800 A | 2/2002 |
| KR | 1020130070927 A | 6/2013 |

* cited by examiner

*Primary Examiner* — Han Yang
(74) *Attorney, Agent, or Firm* — William Park & Associates Ltd.

(57) ABSTRACT

The semiconductor device includes a command decoder and a voltage generation circuit. The command decoder may be suitable for decoding external command signals to generate a preparation signal and a voltage control signal. The voltage generation circuit may be suitable for generating a read voltage signal used in a read operation and a program voltage signal used in a program operation in response to the preparation signal. In addition, the voltage generation circuit may terminate generation of the read voltage signal and the program voltage signal in response to the voltage control signal.

20 Claims, 3 Drawing Sheets

SEMICONDUCTOR DEVICES AND REDUCTION OF OPERATION TIMES

CROSS-REFERENCE TO RELATED APPLICATION

The present application claims priority under 35 U.S.C 119(a) to Korean Application No. 10-2013-0156117, filed on Dec. 16, 2013, in the Korean Intellectual Property Office, which is incorporated herein by reference in its entirety as set forth in full.

BACKGROUND

1. Technical Field

Embodiments of the disclosure relate to semiconductor devices.

2. Related Art

Semiconductor devices may be typically categorized as either volatile memory devices or nonvolatile memory devices. The volatile memory devices lose their stored data when their power supplies are interrupted. In contrast, the nonvolatile memory devices retain their stored data even when their power supplies are interrupted. The nonvolatile memory devices may include various memory cells. For example, the nonvolatile memory devices may be classified into flash memory devices, ferroelectric random access memory (FRAM) devices, magnetic random access memory (MRAM) devices, phase change random access memory (PRAM) devices or the like according to a memory cell structure.

The flash memory devices among the nonvolatile memory devices may be categorized as either NOR-type flash memory devices or NAND-type flash memory devices according to a memory cell array scheme. All of memory cell transistors of the NOR-type flash memory devices are directly connected to bit lines and word lines in parallel. Thus, the NOR-type flash memory devices may exhibit a relatively fast random access time. In contrast, each of the NAND-type flash memory devices includes a plurality of cell strings connected to bit lines in parallel, and each cell string includes a plurality of memory cell transistors which are connected in series. That is, each cell string is electrically connected to a bit line through a single bit line contact. Thus, the NAND-type flash memory devices may exhibit a relatively high integration density.

SUMMARY

According to various embodiments, a semiconductor device includes a command decoder and a voltage generation circuit. The command decoder is suitable for decoding external command signals to generate a preparation signal and a voltage control signal. The voltage generation circuit is suitable for generating a read voltage signal used in a read operation and a program voltage signal used in a program operation in response to the preparation signal. In addition, the voltage generation circuit is suitable for terminating a generation of the read voltage signal and the program voltage signal in response to the voltage control signal.

According to various embodiments, a semiconductor device includes a command decoder, a row decoder and a page buffer unit. The command decoder may be suitable for decoding external command signals to generate a preparation signal, a voltage control signal, a read signal, a program signal and a buffer control signal. The row decoder may be suitable for receiving a row address signal in response to the preparation signal to generate a drain selection signal and a source selection signal to select a memory cell block. Moreover, the row decoder is suitable for generating word line signals, one of which is selectively driven by the row address signal to have a read voltage signal or a program voltage signal supplied in response to the read signal or the program signal. The page buffer unit may be suitable for pre-charging bit lines in response to the preparation signal and suitable for controlling voltage levels of the bit lines in response to the buffer control signal to execute a read operation and a program operation.

According to an embodiment, a semiconductor device may include a command decoder suitable for selectively enabling and generating a preparation signal, a voltage control signal, a read signal, a program signal, and a buffer control signal according to a logic combination of external command signals. The semiconductor device may also include a voltage generation circuit suitable for terminating a generation of a read voltage signal or a program voltage signal when the voltage control signal is enabled.

DETAILED DESCRIPTION

Various embodiments of the invention will be described more fully hereinafter with reference to the accompanying drawings. However, the embodiments described herein are for illustrative purposes and not intended to limit the scope of the invention.

Figure 1:
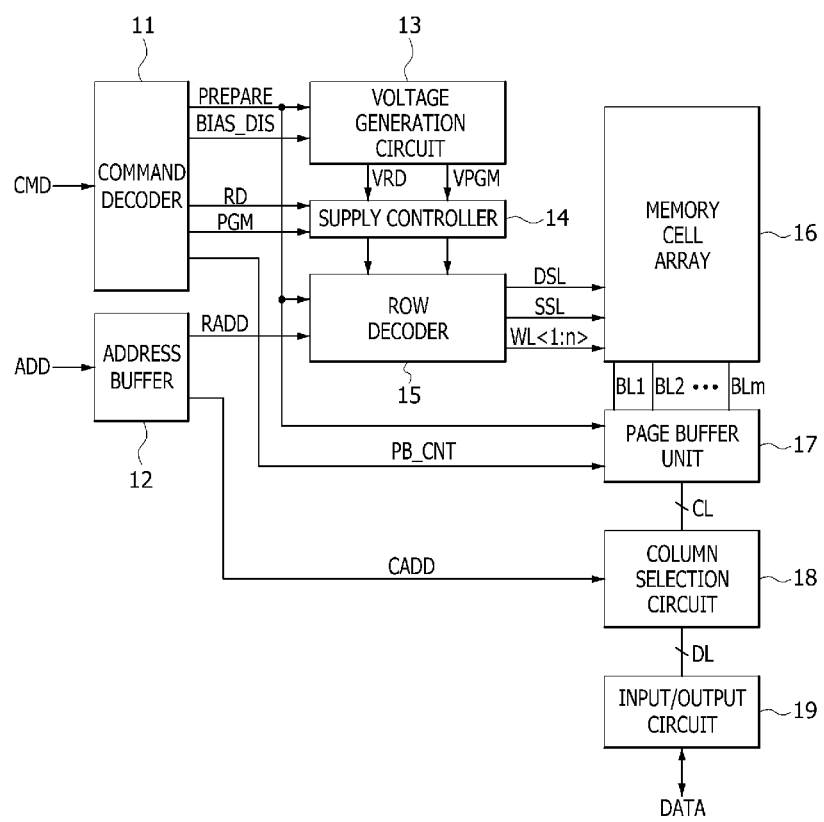
FIG. 1 is a block diagram illustrating a semiconductor device according to an embodiment of the invention.

Referring to FIG. 1, a semiconductor device according to an embodiment may include a command decoder 11, an address buffer 12, a voltage generation circuit 13, a supply controller 14, a row decoder 15, a memory cell array 16, a page buffer unit 17, a column selection circuit 18 and an input/output (I/O) circuit 19.

The command decoder 11 may decode external command signals CMD to generate a preparation signal PREPARE, a voltage control signal BIAS_DIS, a read signal RD, a program signal PGM and a buffer control signal PB_CNT. One of the signals which the command decoder 11 generates may be selectively enabled. The external command signals CMD may be supplied from an external device such as a controller. The external command signals CMD may also include a plurality of bits. The command decoder 11 may selectively enable and generate any one of the preparation signal PREPARE, the voltage control signal BIAS_DIS, the read signal RD, the program signal PGM and the buffer control signal PB_CNT according to a logic combination of the external command signals CMD. The preparation signal PREPARE may be enabled to generate the read signal RD and the program signal PGM. The preparation signal PREPARE may also generate a drain selection signal DSL and a source selection signal SSL to select a memory cell block. Further, the preparation signal PREPARE may pre-charge bit lines BL1~BLm before a read operation and a program operation for a selected memory cell block. The voltage control signal BIAS_DIS may be enabled to terminate generation of the read signal RD or the program signal PGM when the read operation or the program operation for selected memory cell block terminates, and a read operation or a program operation for another memory cell block executes. The read signal RD may be enabled to execute the read operation. The program signal PGM may be enabled to execute the program operation. The buffer control signal PB_CNT may be generated to control voltage levels of the bit lines BL1~BLm to execute the read operation or the program operation. The number of bits included in the buffer control signal PB_CNT may be suitable for being different according to various embodiments.

The address buffer 12 may receive and buffer external address signals ADD to generate a row address signal RADD and a column address signal CADD. The row address signal RADD may include information on generation of the drain selection signal DSL and the source selection signal SSL to select a memory cell block and information on selective drive of word line signals WL<1:n>. The column address signal CADD may include information on selection of page buffer included in the page buffer unit 17.

The voltage generation circuit 13 may generate a read voltage signal VRD or a program voltage signal VPGM. Moreover, the voltage generation circuit may generate the read voltage signal VRD or the program voltage signal VPGM when the preparation signal PREPARE is enabled before the read operation or the program operation. In addition, the voltage generation circuit 13 may also terminate generation of the read voltage signal VRD or the program voltage signal VPGM. Further, the voltage generation circuit 13 may terminate the generation of the read voltage signal VRD or the program voltage signal VPGM when the voltage control signal BIAS_DIS is enabled after the read operation or the program operation terminates.

The supply controller 14 may supply the read voltage signal VRD or the program voltage signal VPGM generated from the voltage generation circuit 13 to the row decoder 15 in response to the read signal RD or the program signal PGM becoming enabled.

The row decoder 15 may receive the row address signal RADD to generate the drain selection signal DSL and the source selection signal SSL to select a memory cell block if the preparation signal PREPARE is enabled. Moreover, the row decoder 15 may generate the word line signals WL<1:n>. One of the word line signals WL<1:n> is selectively driven to have the read voltage signal VRD or the program voltage signal VPGM by the row address signal RADD in response to the execution of the read operation or the program operation.

The memory cell array 16 may include a plurality of nonvolatile memory cells in which data is stored during the program operation or in which the data is outputted during the read operation. The memory cell array 16 may include a plurality of memory cell blocks (not shown). One of the plurality of memory cell blocks is selected by the drain selection signal DSL and the source selection signal SSL. Each of the memory cell blocks may include a plurality of memory cells. The plurality of memory cells may be either programmed by the word line signals WL<1:n> driven to have the program voltage signal VPGM or the data of which are read out by the word line signals WL<1:n> driven to have the read voltage signal VRD. The drain selection signal DSL may control the electrical connection between cell strings (not shown) and the bit lines BL1~BLm in the memory cell block. More specifically, the drain selection signal DSL may be a signal applied to gates of string selection transistors electrically coupled between the cell strings and the bit lines BL1~BLm. The source selection signal SSL may control the electrical connection between the cell strings and a common ground line (not shown) in the memory cell block. For instance, the source selection signal SSL may be a signal applied to gates of ground selection transistors electrically coupled between the cell strings and the common ground line (also, referred to as a common source line). The memory cell array 16 may have substantially the same configuration as the memory cell arrays of general nonvolatile memory devices. Accordingly, detailed descriptions of the memory cell array 16 will be omitted hereinafter.

The page buffer unit 17 may pre-charge voltage levels of the bit lines BL1~BLm if the preparation signal PREPARE is enabled. In addition, the page buffer unit 17 may control the voltage levels of the bit lines BL1~BLm in response to the buffer control signal PB_CNT and when the read operation or the program operation is executed. The voltage levels of the bit lines BL1~BLm controlled during the read operation may be set to be different according to various embodiments. Similarly, the voltage levels of the bit lines BL1~BLm controlled during the program operation may be set to be different according to various embodiments. The page buffer unit 17 may include a plurality of page buffers (not shown). Moreover, at least one of the plurality of page buffers may be selected by the column address signal CADD.

During the read operation, the column selection circuit 18 may receive data of the page buffer (not shown) selected by the column address signal CADD through column lines CL. In addition, the column selection circuit may also output the data of the selected page buffer through data lines DL. During the program operation, the column selection circuit 18 may transmit data on the data lines DL to the column lines CL. Further, the column selection circuit 18 may then store the data on the column lines CL into the page buffer (not shown) selected by the column address signal CADD. The I/O circuit 19 may output the data on the data lines DL to an external device during the read operation and may transmit the data supplied from the external device to the data lines DL.

Figure 2:
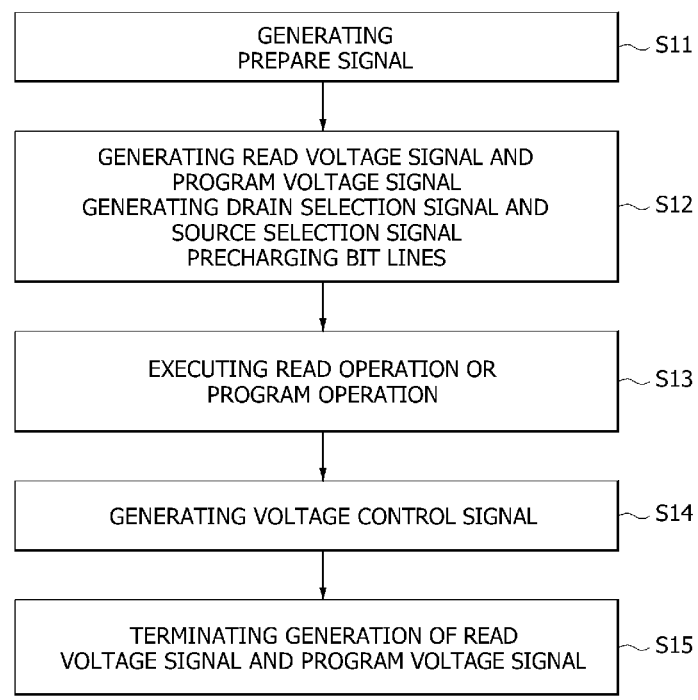
FIG. 2 is a flowchart illustrating an operation of the semiconductor device shown in FIG. 1.

Referring to FIG. 2, the external command signals CMD may be decoded to generate the preparation signal PREPARE which is enabled before the read operation or the program operation (see the step S11).

If the preparation signal PREPARE is enabled, the voltage generation circuit 13 may generate the read voltage signal VRD and the program voltage signal VPGM. In addition, the row decoder 15 may generate the drain selection signal DSL and the source selection signal SSL to select a memory cell block. Further, the page buffer unit 17 may pre-charge the voltage levels of the bit lines BL1~BLm (see the step S12).

At the above state, the read operation and the program operation for the selected memory cell block may be executed (see the step S13). In such an instance, at least one of the read operation and the program operation may be executed at least twice. The read operation may be executed to output the data stored in the memory cells selected by the row address signal RADD and the column address signal CADD to an external device. Moreover, the data may be outputted if the command decoder 11 decodes the external command signals CMD to generate the read signal RD which is enabled. The program operation may be executed to store data supplied from an external device into the memory cells selected by the row address signal RADD and the column address signal CADD. Further, the data may be stored if the command decoder 11 decodes the external command signals CMD to generate the read signal RD which is enabled. The read operation and the program operation may be executed using the same manners as the general read operation and the general program operation.

The command decoder 11 may decode the external command signals CMD to generate the voltage control signal BIAS_DIS which is enabled when the read operation or the program operation for selected memory cell block terminates, and a read operation or a program operation for another memory cell block executes (see the step 14).

The voltage generation circuit 13 may terminate generation of the read voltage signal VRD and the program voltage signal VPGM if the voltage control signal BIAS_DIS is enabled. (see the step 15).

Figure 3:
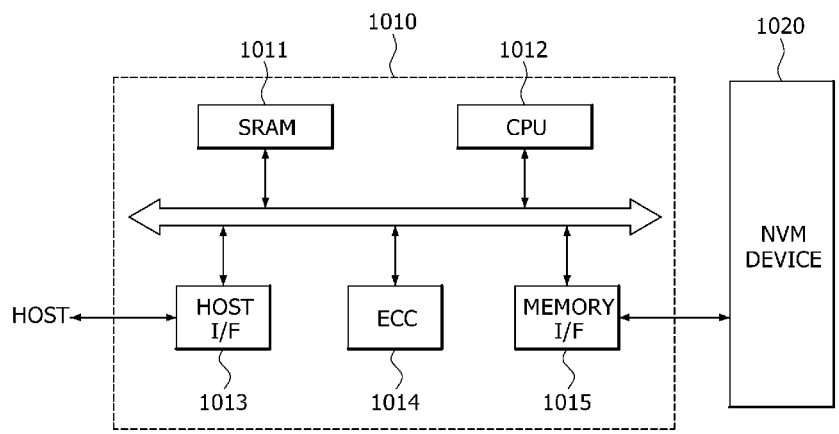
FIG. 3 illustrates a schematic block diagram of a memory system according to an embodiment of the invention.

Referring to FIG. 3, a memory system 1000 may include a non-volatile memory device 1020 and memory controller 1010. The non-volatile memory device 1020 may be suitable for including the above-described semiconductor device. The memory controller 1010 may be suitable for controlling the non-volatile memory device 1020 in a generation operation mode. A general operation mode may include a program loop, a read operation or an erase loop.

The memory system 1000 may be a solid state disk (SSD) or a memory card in which the non-volatile memory device 1020 and the memory controller 1010 are combined. A static random access memory (SRAM) 1011 may function as an operation memory of a processing unit (CPU) 1012. A host interface 1013 may include a data exchange protocol of a host being coupled to the memory system 1000. An error correction code (ECC) block 1014 may detect and correct errors included in a data read from the non-volatile memory device 1020. A memory interface (I/F) 1015 may interface with the non-volatile memory device 1020. The CPU 1012 may perform the general control operation for data exchange of the memory controller 1110.

What is claimed is:

1. A semiconductor device comprising:
   a command decoder suitable for decoding external command signals to generate a preparation signal and a voltage control signal; and
   a voltage generation circuit suitable for generating a read voltage signal used in a read operation and a program voltage signal used in a program operation in response to the preparation signal and suitable for terminating a generation of the read voltage signal and the program voltage signal in response to the voltage control signal, wherein the voltage control signal is enabled when the read operation or the program operation for one memory cell block terminates, and a read operation or a program operation for another memory cell block executes.

2. The semiconductor device of claim 1, further comprising:
   a page buffer unit suitable for pre-charging bit lines in response to the preparation signal.

3. The semiconductor device of claim 2, wherein the command decoder decodes the external command signals to generate a read signal, a program signal and a buffer control signal.

4. The semiconductor device of claim 3, wherein the page buffer unit controls voltage levels of the bit lines for the read operation and the program operation in response to the buffer control signal.

5. The semiconductor device of claim 1, further comprising:
   a supply controller suitable for controlling a supply of the read voltage signal and the program voltage signal in response to the read signal and the program signal.

6. The semiconductor device of claim 1, further comprising:
   a row decoder suitable for receiving a row address signal in response to the preparation signal to generate a drain selection signal and a source selection signal to select a memory cell block.

7. The semiconductor device of claim 6, wherein the row decoder generates word line signals, one of which is selectively driven to have the read voltage signal or the program voltage signal by the row address signal when the read operation or the program operation is executed.

8. A semiconductor device comprising:
   a command decoder suitable for decoding external command signals to generate a preparation signal, a voltage control signal, a read signal, a program signal and a buffer control signal;
   a row decoder suitable for receiving a row address signal in response to the preparation signal to generate a drain selection signal and a source selection signal to select a memory cell block and suitable for generating word line signals, one of which is selectively driven by the row address signal to have a read voltage signal or a program voltage signal supplied in response to the read signal or the program signal; and
   a page buffer unit suitable for pre-charging bit lines in response to the preparation signal and control voltage levels of the bit lines in response to the buffer control signal to execute a read operation and a program operation.

9. The semiconductor device of claim 8, further comprising:
   a voltage generation circuit suitable for generating a read voltage signal and a program voltage signal in response to the preparation signal and suitable for terminating a generation of the read voltage signal and the program voltage signal in response to the voltage control signal, wherein the voltage control signal is enabled when the read operation or the program operation for one memory cell block terminates, and a read operation or a program operation for another memory cell block executes.

10. The semiconductor device of claim 9, further comprising:
    a supply controller suitable for controlling supply of the read voltage signal and the program voltage signal in response to the read signal and the program signal.

11. The semiconductor device of claim 9, wherein the voltage control signal is enabled after the read operation or the program operation terminates.

12. The semiconductor device of claim 9, wherein the voltage generation circuit is suitable for generating the read voltage signal or the program voltage signal before the read operation or the program operation.

13. The semiconductor device of claim 9, wherein the voltage generation circuit is suitable for terminating the generation of the read voltage signal or the program voltage signal after the read operation or the program operation terminates.

14. The semiconductor device of claim 9, wherein the preparation signal is suitable for being enabled before the read operation or the program operation.

15. A semiconductor device comprising:
    a command decoder suitable for selectively enabling and generating a preparation signal, a voltage control signal, a read signal, a program signal, and a buffer control signal according to a logic combination of external command signals; and
    a voltage generation circuit suitable for terminating a generation of a read voltage signal or a program voltage signal when the voltage control signal is enabled, wherein the voltage control signal is enabled when the read operation or the program operation for one memory cell block terminates, and a read operation or a program operation for another memory cell block executes.

16. The semiconductor device of claim 15, wherein the voltage control signal is enabled to terminate a generation of the read signal or the program signal after the read operation or the program operation terminates.

17. The semiconductor device of claim 15, wherein the buffer control signal is suitable for controlling voltage levels of a plurality of bit lines to allow the read operation or the program operation to be enabled.

18. The semiconductor device of claim 15, wherein the read operation and the program operation are executed more than once.

19. The semiconductor device of claim 15, wherein the command decoder is suitable for decoding at least one external command signal to generate the voltage control signal enabled when the read operation and program operation are terminated.

20. The semiconductor device of claim 19, wherein the voltage generation circuit is enabled to terminate the generation of the read voltage signal and the program voltage signal in response to the voltage control signal being generated.

* * * * *